United States Patent [19]

Kongable et al.

[11] 4,442,500

[45] Apr. 10, 1984

[54] NARROW BAND DIGITAL FILTER

[75] Inventors: Lowell S. Kongable, Paradise Valley, Ariz.; Clint E. Bauer, Kaysville, Utah

[73] Assignee: Motorola, Inc., Schaumburg, Ill.

[21] Appl. No.: 312,062

[22] Filed: Oct. 16, 1981

[51] Int. Cl.³ ............................................. H04B 1/16
[52] U.S. Cl. .................................. 364/724; 375/96; 328/167
[58] Field of Search ............... 328/162, 165, 167, 138; 375/103, 96, 97, 45, 81; 455/227, 237, 242, 307, 312, 317, 339; 307/234, 520; 364/724, 725

[56] References Cited

U.S. PATENT DOCUMENTS

| Re. 29,257 | 6/1977 | Nash et al. | 375/103 |
| 3,376,412 | 4/1968 | Prager | 375/103 |
| 3,671,867 | 6/1972 | Schwarz | 455/237 |
| 3,674,935 | 7/1972 | Lawrence | 375/81 |
| 3,737,636 | 6/1973 | Esteban | 328/167 |
| 3,821,563 | 6/1974 | Warren | 328/167 |
| 3,958,133 | 5/1976 | Albano et al. | 328/165 |
| 4,099,245 | 7/1978 | Maysonett | 364/724 |
| 4,101,839 | 7/1978 | Poole et al. | 328/165 |
| 4,105,980 | 8/1978 | Cowardin et al. | 328/165 |
| 4,137,510 | 1/1979 | Iwahara | 328/167 |
| 4,344,038 | 8/1982 | Streeter | 328/138 |
| 4,351,032 | 9/1982 | Challen | 364/724 |

Primary Examiner—Jerry Smith
Assistant Examiner—Jameson Lee
Attorney, Agent, or Firm—William E. Koch

[57] ABSTRACT

A narrow band digital filter is disclosed for rejecting all undesired frequencies, providing a binary signal indicative of when the input frequency is within an acceptance band. The digital filter may be placed within a stereo AM receiver to monitor the pilot tone of the incoming signal with clocking pulses provided by the IF stage of the radio receiver.

15 Claims, 4 Drawing Figures

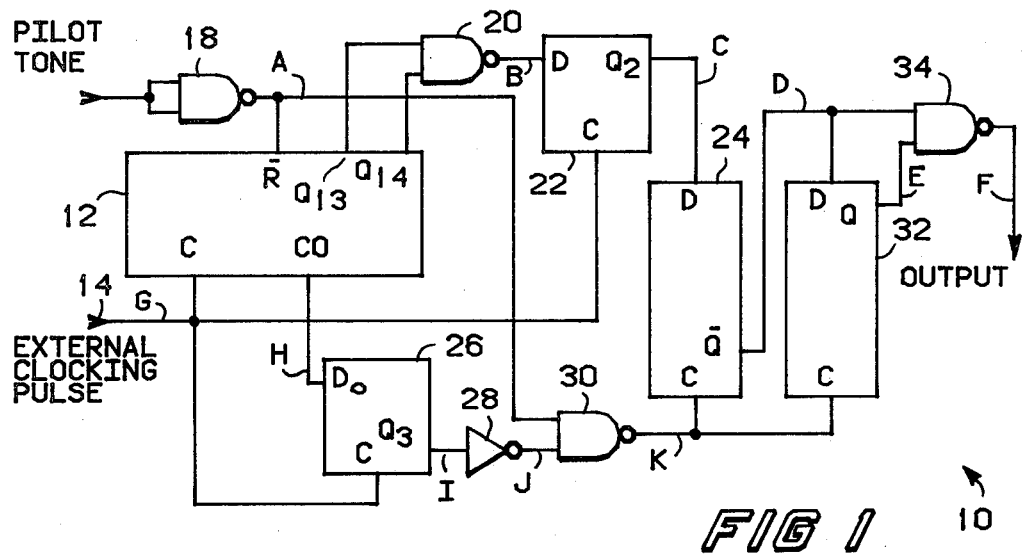
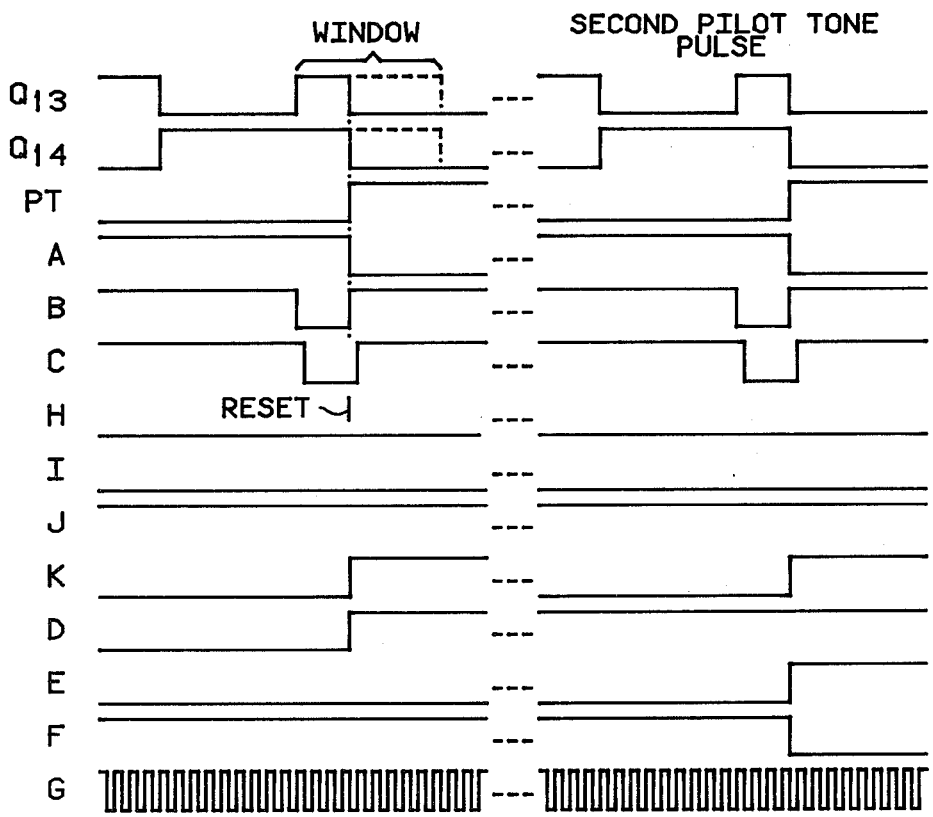

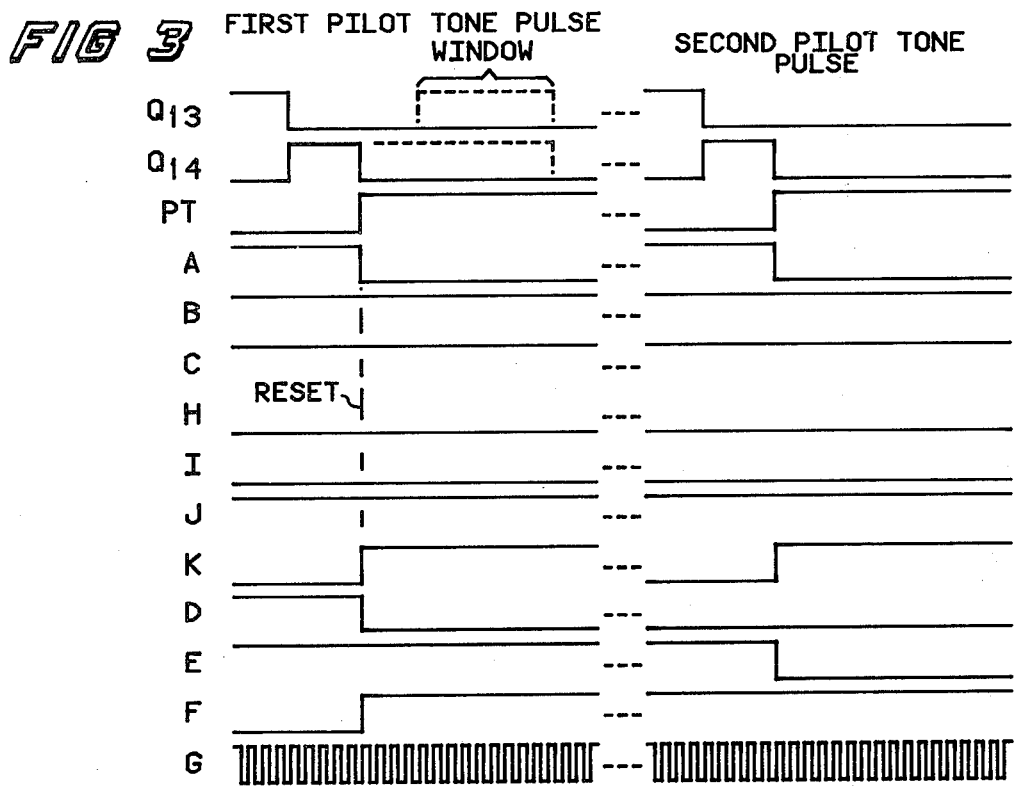
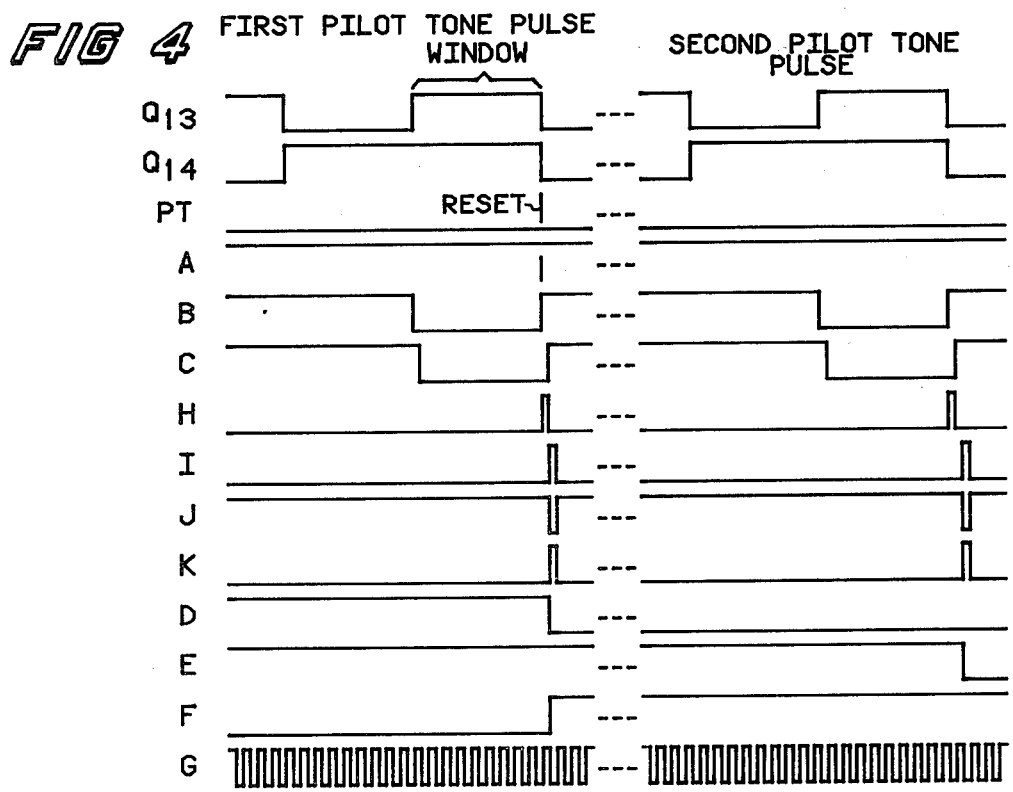

NARROW BAND DIGITAL FILTER

BACKGROUND OF THE INVENTION

1. Field of the Invention:

This invention relates to narrow band pass systems and more specifically to a digital filter that rejects all frequencies other than the desired pilot tone of a stereo AM radio receiver.

2. Prior Art:

Recent advances in the art of stereo AM radios, along with the decision to commerically market these radios, have emphasized the need to develop the most effective stereo AM receiver at the lowest price. A necessary component of a stereo AM receiver is a bandpass filter that determines when a left-right (L-R) signal is being adequately received, thereafter providing a signal that activates the stereo channel circuits of the receiver. When only the L+R signal is received, the mono channel alone is active.

Filters that convert two inputs of different frequencies into an output in an analog fashion are old in the art. Typically the output of a pair of bandpass filters, each tuned separately to one of the input frequencies, are compared and the greater output of the two bandpass filters determines the overall output. However, high Q analog filters may oscillate (ring) at their natural frequency creating a distortion in the passed signal.

Many types of digital filters are also old in the art. Such filters may be used in frequency-shift keying receivers which provide a logic "1" output for a first frequency input and a logic "0" output for a second frequency input. For example, U.S. Pat. No. Re.29,257 uses these binary outputs as input to a flip-flop which conditions an up-down counter using a clock independent of the flip-flop clock. See also U.S. Pat. No. 3,611,298, wherein bitts are represented by a group of substantially sinusoidal waveforms, and pulses having a given repetition rate are counted during each of the waveforms.

In general, digital filters of the prior art normally require external components, such as additional clocks, resistors, or capacitors and allow a wider range of frequencies to pass through the filters.

Thus, the need exists for an inexpensive narrow band digital filter, which does not ring, for a stereo AM radio receiver that requires no external components.

SUMMARY OF THE INVENTION

Accordingly, it is an object of this invention to provide an improved narrow band digital filter.

It is another object of this invention to provide a narrow band digital filter that rejects undesired frequencies of the pilot tone of a stereo AM radio receiver for activating the stereo channel circuitry only when desired frequencies within a narrow acceptance band are received.

A further object of this invention is to provide a narrow band digital filter that has a bandwidth waveform with sharp transitions for use in a stereo AM radio receiver.

Yet another object of this invention is to provide a narrow band digital filter that rejects undesired frequencies of the pilot tone of a stereo AM radio receiver that is clocked by a pulse from the IF stage of the radio signal.

According to one aspect of the invention, there is provided a digital filter having a first input means for receiving input signals to be filtered, and a second input means for receiving a clock signal, the filter comprising a timing means coupled to both input means for generating a first signal corresponding to a period of time and a second signal corresponding to the end of the period of time, a delay means coupled to the timing means and the second input means for delaying the second signal, a circuit means coupled to the delay means and the first input means for generating an internal clock signal, and a logic means coupled to the timing means and circuit means for generating an output indicative of whether a predetermined number of successive input signals are within or out of a predetermined frequency range.

The above and other objects, features and advantages of the present invention will be better understood from the following detailed description taken in conjunction with the accompanying drawings, in which:

BRIEF DESCRIPTION OF THE DRAWINGS

FIG. 1 illustrates in block diagram form the narrow band digital filter of the invention.

FIG. 2 are successive timing diagrams for when the pilot tone pulses within the window.

FIG. 3 are successive timing diagrams for when the pilot tone pulses before the window.

FIG. 4 are successive timing diagrams for when the pilot tone pulses after the window.

DETAILED DESCRIPTION OF THE PREFERRED EMBODIMENT

In order to provide a clear explanation, the invention is described hereinafter with reference to its application in a stereo AM radio receiver. However, the digital filter could also be used for filtering unwanted signals in a number of other applications.

Referring to FIG. 1, an embodiment of the narrow band digital filter is illustrated as an integrated circuit 10 comprising a fifteen-stage flip-flop counter 12, a first NAND gate 18, a second NAND gate 20, a two-stage flip-flop delay circuit 22, a first flip-flop 24, a four-stage flip-flop delay circuit 26, an inverter 28, a third NAND gate 30, a second flip-flop 32, and a fourth NAND gate 34.

A counter 12 receives an external clocking pulse over conductor 14. The external clocking pulse G may actually be the limited signal taken from the IF stage of the stereo AM radio receiver, thereby eliminating the need for an independent clock generator. The counter 12 further receives a reset signal A from first NAND gate 18 which acts as a wave shaper. Both inputs to first NAND gate 18 are connected together and receive a pilot tone taken from the incoming signal to the radio. The audio signal may have been removed previously. The outputs from the fourteenth and fifteenth stages of the fifteen-stage flip-flop counter 12, Q13 and Q14 respectively, are applied to second NAND gate 20, the output therefrom being the input to the first stage of delay circuit 22. The delay circuit 22 receives an external clocking pulse G, and the output therefrom is applied to first flip-flop 24.

If the frequency of the pilot tone is too low, a carry out signal from the counter 12 is applied as the input to delay circuit 26, which receives an external clocking pulse. The output, Q3 of delay circuit 26 is applied to inverter 28, with the output therefrom applied as one input to third NAND gate 30. The output from first NAND 18 is applied as the other input to third NAND gate 30. The output from third NAND gate 30 provides an internal clocking pulse to first flip-flop 24 and second flip-flop 32. The output of first flip-flop 24 is applied as inputs to both second flip-flop 32 and fourth NAND gate 34. The output of second flip-flop 32 is applied as the other input to fourth NAND gate 34. The output of fourth NAND gate 34 is the output of integrated circuit 10 that comprises the narrow band digital filter described herein.

The operation of the integrated circuit 10 may best be understood by referring to the timing diagrams of FIGS. 2-4, with the aid of FIG. 1. The external clocking pulse G applied to counter 12 is taken from the IF signal of the receiver. This signal is not to be limited to a specific frequency, but may, for example, be 260 KHz. As counter 12 proceeds to the fifteenth stage, a window is defined by the simultaneous logic "1" stages of both Q13 and Q14. This window occurs during the last half of the logic "1" state of Q14 and is 31.5 msec in duration. This window "opens" 94.5 msec after a pulse from the external clocking pulse G that occurs subsequent to the pilot tone releasing counter 12 and "closes" 126 msec after the first stage of counter 12 is activated. It may be seen from the following frequency-table that if an external clock pulse of 260 KHz is used, the acceptance band of the pilot tone ranges from approximately 4.0 to 5.3 Hz.

The pilot tone frequencies listed in column one reflect possible values that may be received from the incoming signal to the radio. Column two merely lists the period for those frequencies. Column three lists the period divided by two. Since the counter 12 is released from reset on the fall of the pilot tone pulse, and the internal clocking pulse K is generated by the rise of the pilot tone pulse, the times listed in column three will compare with the time required to open and close the window of counter 12.

| Pilot Tone Frequency (Hz) | Pilot Tone Period (msec) | Pilot Tone Period/2 (msec) |
| --- | --- | --- |
| 4.0 | 250 | 125 |
| 4.5 | 222 | 111 |
| 5.0 | 200 | 100 |
| 5.5 | 182 | 91 |
| 6.0 | 167 | 83.5 |

If the desired pilot tone is 5.0 Hz with a half period of 100 msec, for example, the pilot tone will be coincident with the window opening of 94.5 msec and closing at 126 msec, providing a signal at the output of integrated circuit 10 indicative of a desired incoming stereo signal. In order to center the desired frequency within the acceptance band, the count of counter 12 may be preset to reflect the necessary timing. For example, for the 5.0 Hz pilot tone, a 10 msec offset would cause the window to open and close 10 msec earlier. The adjusted acceptance band would then range from approximately 4.3 to 5.9 msec. Depending on the frequency of the pilot tone, three situations may occur: the pilot tone occurring during the window, prior to the window, and subsequent to the window.

Referring to FIG. 2, it may be seen that the occurrence of two successive pilot tone pulses during the window, provides for a favorable output from the digital filter 10. When Q13 and Q14 are high, B goes low, with C, which is the output Q of delay circuit 22, going low after two external clocking pulses G. When the pilot tone, PT, goes high, A goes low resetting counter 12 and causing the output (internal clocking pulse K) of third NAND gate 30 to go high, thereby clocking both first and second flip-flops 24 and 32, respectively. Since clocking pulse K arrives at first and second flip-flops 24 and 32 subsequent to the signal C going low, the output D from first flip-flop 24 will go high. Assuming E was previously low, F will be high, indicating an undesired frequency. On the next successive pilot tone pulse in the window, E will go high along with D to cause F to go low, indicating a desired frequency. Therefore, two good pulses of a desired frequency will provide a favorable logic "0" output. Since counter 12 was reset prior to a carry out signal, H and I remain low with J high, having no effect on third NAND gate 30.

Referring to FIG. 3 it may be seen that when the pilot tone pulses prior to the window, the output F of digital filter 10 goes high (assuming that output F was already low) after only one pulse of the pilot tone indicating an undesired frequency of digital filter 10. When the pilot tone goes high, A goes low resetting counter 12 and causing internal clocking pulse K to go high, thus clocking both first and second flip-flops 24 and 32. Since the last two stages of fifteen-stage flip-flop counter 12 have not been allowed to progress to the window, one or both of Q13 and Q14 remain low. Therefore, B is high and C is also high. At internal clocking pulse K, D goes low and F goes high indicating an undesirable frequency for the pilot tone. Again, since counter 12 was reset prior to a carry out signal, H and I remain low with J high, having no effect on third NAND gate 30. When D went low, it set the input to second flip-flop 32, and on the next pilot tone pulse, PT, occurring prior to the window, and generating associated internal clocking pulse K, E goes low and F remains high. Therefore, the filter 10 requires one pulse of an undesired frequency to inactivate the radio circuitry.

Referring to FIG. 4, it may be seen when the pilot tone occurs subsequent to the window, the output F of digital filter 10 goes high indicating an undesired frequency for the pilot tone. Since the pilot tone has yet to pulse, A will remain high and not reset counter 12 nor cause third NAND gate 30 to provide an internal clocking pulse K. Counter 12 will internally reset itself as Q14 goes low. As the reset signal occurs, both Q13 and Q14 go low, B goes high with C going high after two external clocking pulses G. Coincidental with the internal reset signal of counter 12, a carry out signal H is applied as a logic "1" input to delay circuit 26. After a delay of four external clocking pulses associated with the four stages of delay circuit 26, I goes high and J goes low. Therefore, internal clocking pulse K goes high and clocks both the first and second flip-flops 24 and 32. Because of the four-stage delay provided by delay circuit 26, C has already gone high. Therefore, D will go low causing the output F of digital filter 10 to go high, indicating an undesired frequency. On the termination of the next window, and the occurrence of the next internal clocking pulse K, E will also go high. Therefore, it again takes only one pulse of the pilot tone having an undesired frequency to inactivate the circuits of the radio receiver.

In summary, two pulses of the pilot tone in the window which reflects an acceptable frequency, will provide a favorable output at F, while only one pulse, either before or after the window, will provide an unfavorable output at F. However by changing the number of flip-flops at the output, i.e. first and second flip-flops 24 and 32, the stereo circuit can be turned on or off with any number of pulses. Furthermore, the number of stages associated with two-stage flip-flop delay circuit 22 and four-stage flip-flop delay circuit 26 have been arbitrarily chosen to provide a delayed timing sequence for signal C and the internal clocking pulse K. Other numbered combinations of stages are possible; therefore, the narrow band digital filter 10 described herein is not to be limited to a specific number of stages for those flip-flops.

The invention may be embodied in other specific forms without departing from the spirit or essential characteristics thereof. The present embodiment is therefore to be considered in all respects as illustrative and not restrictive, and all changes which come within the meaning and range of equivalency of the claims and therefore intended to be embodied therein.

What is claimed is:

1. A digital filter having a first input means adapted to receive an input signal, said input signal having a plurality of pulses in sucession which have a period that may vary and a second input means adapted to receive a clock signal, said filter comprising:

timing means coupled to said first and second input means and responsive to said input signal and said clock signal for generating a first signal having a first and a second state, said first state corresponding to a period within a predetermined range, and for generating a second signal coinciding with the end of said period of time;

first delay means coupled to said timing means and to said second input means and responsive to said second signal and said clock signal for delaying said second signal;

circuit means coupled to said first delay means and to said first input means and responsive to said delayed second signal and said input signal for generating an internal clock signal; and logic means coupled to said timing means, said circuit means and said second input means and responsive to said first signal, said internal clock signal, and said clock signal for generating an output of a first polarity when said plurality of pulses are within a predetermined frequency range and for generating an output of a second polarity when said plurality of pulses are not within said predetermined frequency range.

2. A digital filter according to claim 1 wherein said timing means comprises a binary counter.

3. A digital filter according to claim 2 wherein said binary counter includes a reset input responsive to said input signal such that said second signal is generated only if said period ends prior to said counter being reset.

4. A digital filter according to claim 3 wherein said binary counter comprises a plurality of flip-flops arranged in sequential order.

5. A digital filter according to claim 1 wherein said first delay means is a shift register having a plurality of flip-flops.

6. A digital filter according to claim 1 wherein said circuit means comprises a logic gate.

7. A digital filter according to claim 2 wherein said logic means comprises a logic control circuit having a plurality of flip-flops and a logic gate coupled to said logic control circuit for generating said output of said first and second polarity.

8. A digital filter according to claim 7 wherein said logic means further comprises a second delay means coupled to said binary counter and to said second input means and responsive to said first signal and said clock signal for delaying said first signal.

9. A digital filter according to claim 8 wherein said plurality of flip-flops comprises:

a first D-type flip-flop coupled to said second delay means and said circuit means and responsive to said delayed first signal and said internal clock signal and having a first flip-flop output; and a second D-type flip-flop coupled to said first D-type flip-flop and said circuit means and responsive to said first flip-flop output and said internal clock signal.

10. A digital filter for activating circuitry of a stereo AM radio receiver, having a first input means adapted to receive pilot tone pulses of a transmitted stereo AM signal, said pulses having a period which may vary, and a second input means adapted to receive a clock signal from circuitry within said stereo AM radio receiver, said filter comprising:

timing means coupled to said first and second input means and responsive to said pilot tone pulses and said clock signal for generating a first signal having a first and a second state, said first state corresponding to a period of time within a predetermined range and for generating a second signal coincident with the end of said period of time;

first delay means coupled to said timing means and to said second input means and responsive to said second signal and said clock signal for delaying said second signal;

circuit means coupled to said first delay means and to said first input means and responsive to said delayed second signal and said input signal for generating an internal clock signal; and logic means coupled to said timing means, said circuit means and said second input means and responsive to said first signal, said internal clock signal, and said clock signal for generating an output of a first polarity when said pilot tone pulses are within a predetermined frequency range and for generating an output of a second polarity when said pilot tone pulses are outside said predetermined frequency range.

11. A digital filter according to claim 10 wherein said timing means is a binary counter in which said first state corresponds to a decoded state of said counter, said binary counter having a reset input which is responsive to the termination of a pulse said input signal such that said second signal is generated only if said decoded state ends prior to said counter being reset.

12. A digital filter according to claim 11 wherein said first delay means is a shift register having a plurality of flip-flops.

13. A digital filter according to claim 11 wherein said logic means comprises a logic control circuit having a plurality of flip-flops and a logic gate coupled to said logic control circuit for generating said output of said first and second polarity.

14. A digital filter according to claim 13 wherein said logic means further comprises a second delay means coupled to said binary counter and to said second input means and responsive to said first signal and said clock signal for delaying said first signal.

15. A digital filter according to claim 14 wherein said plurality of flip-flops comprises:

a first D-type flip-flop coupled to said second delay means and said circuit means and responsive to said first flip-flop output and said internal clock signal and having a first flip-flop output; and a second D-type flip-flop coupled to said first D-type flip-flop and responsive to said internal clock signal, said output of said first polarity activating said circuitry of said stereo AM radio receiver and said output of said second polarity deactivating said circuitry of said stereo AM radio receiver.

* * * * *